United States Patent
Nix

(10) Patent No.: US 7,084,683 B1
(45) Date of Patent: *Aug. 1, 2006

(54) HIGH-SPEED DIFFERENTIAL FLIP-FLOP WITH COMMON-MODE STABILIZATION

(75) Inventor: Michael A. Nix, Buda, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/837,185

(22) Filed: Apr. 30, 2004

Related U.S. Application Data

(63) Continuation-in-part of application No. 09/994,233, filed on Nov. 26, 2001, now Pat. No. 6,819,156.

(51) Int. Cl.
*H03K 3/283* (2006.01)

(52) U.S. Cl. ................... 327/203; 327/208; 327/211

(58) Field of Classification Search ........ 327/199–203, 327/208, 210–212, 214–219, 55, 54, 57
See application file for complete search history.

(56) References Cited

U.S. PATENT DOCUMENTS

| | | | | |
|---|---|---|---|---|
| 5,036,217 A | | 7/1991 | Rollins et al. ............... 327/203 |
| 5,049,760 A | * | 9/1991 | Ooms ......................... 327/212 |
| 5,384,493 A | | 1/1995 | Furuki ........................ 327/203 |
| 5,777,491 A | | 7/1998 | Hwang et al. ............... 326/113 |
| 6,002,270 A | | 12/1999 | Timoc ......................... 327/57 |
| 6,018,260 A | | 1/2000 | Gabara ........................ 327/201 |
| 6,232,810 B1 | * | 5/2001 | Oklobdzija et al. ......... 327/217 |
| 6,337,583 B1 | | 1/2002 | Ooishi et al. ............... 326/119 |
| 6,373,292 B1 | | 4/2002 | Choe .......................... 326/121 |
| 6,433,586 B1 | | 8/2002 | Ooishi ........................ 326/93 |
| 6,472,920 B1 | * | 10/2002 | Cho et al. ................... 327/215 |
| 6,819,156 B1 | * | 11/2004 | Nix ............................ 327/203 |
| 6,825,696 B1 | * | 11/2004 | Jaussi et al. ................. 327/55 |
| 2003/0052720 A1 | | 3/2003 | Tung et al. .................. 327/218 |

FOREIGN PATENT DOCUMENTS

JP 2000244287 9/2000

* cited by examiner

*Primary Examiner*—Long Nguyen
(74) *Attorney, Agent, or Firm*—Scott Hewett

(57) ABSTRACT

A differential flip-flop (400) has an output stage (402) with first and second input terminals (X1, X2), first and second output terminals (Q, Qb), a first voltage supply terminal (Vss), a first transistor (435) having a first current-handling terminal connected to the first output terminal (Q), a second current-handling terminal connected to the second output terminal (Qb), and a first control terminal connected to a clock signal (C). A second transistor has a third current-handling terminal connected to the first output terminal (Q), a fourth current-handling terminal connected to the voltage supply terminal (Vss), and a second control terminal connected to a first input terminal (X1) of the output stage. A third transistor (440) has a fifth current-handling terminal connected to the first output terminal (Q), a sixth current-handling terminal connected to the voltage supply terminal (Vss), and a third control terminal connected to the second output terminal (Qb).

13 Claims, 5 Drawing Sheets

HIGH-SPEED DIFFERENTIAL FLIP-FLOP WITH COMMON-MODE STABILIZATION

This application if a Continuation-In-Part (CIP) of application Ser. No. 09/994,233 filed on Nov. 26, 2001, now U.S. Pat. No. 6,819,156.

FIELD OF THE INVENTION

This invention relates generally to logic circuits commonly known as flip-flops, which are also known as latches and bi-state multi-vibrators, and more specifically to a differential flip-flop capable of operating at both very high and very low frequencies.

BACKGROUND OF THE INVENTION

Logic circuits can be classified into two broad categories, combinational logic circuits and sequential logic circuits. The basic building block of sequential logic circuits is the flip-flop, also called a bi-stable multi-vibrator or latch. In most cases, logic circuits employ both sequential and combinational logic.

FIG. 1 (prior art) depicts an exemplary logic circuit 100 that includes both combinational and sequential logic elements. Logic circuit 100 is a divide-by-five counter with a NAND gate 105 and a NOR gate 106 in a feedback path of a series of differential-input flip-flops 110. Logic circuit 100 receives a pair of complementary clock signals C and Cb, which extend to clock input terminals of each of the flip-flops 110. Circuit 100 produces a pair of complementary clock signals C/5 and Cb/5 with a frequency one fifth that of the input clock signals. The differential nature of circuit 100 allows for higher clock frequencies than would a similar divide-by-five circuit using single-ended sequential logic elements.

FIG. 2 (prior art) depicts an embodiment of a differential-input flip-flop 110 for use in circuit 100 of FIG. 1. The operation of flip-flop 110 is commonly understood by those of skill in the art, so a detailed description of flip-flop 110 is omitted here for brevity.

If manufactured using commonly available CMOS processes, flip-flop 110 can perform with clock frequencies as high as about 2 GHz. Unfortunately, modern high-speed digital communication systems employ clock and data recovery circuits operating in the 10 Gb/s range. The frequency response of flip-flop 110 is therefore insufficient to meet the needs of some modern systems.

Differential return-to-zero-type flip-flops have been developed for high-frequency operation, but some embodiments do not work well at lower frequencies (below about 1 GHz), particularly when the manufacturing process or operating environment (e.g. temperature) changes. Therefore, a high-speed differential flip-flop that overcomes these disadvantages is desirable.

SUMMARY OF THE INVENTION

A differential flip-flop in accordance with one embodiment has an output stage with a first input terminal, a second input terminal, a first output terminal, a second output terminal, a first voltage supply terminal, a first transistor having a first current-handling terminal connected to the first output terminal, a second current-handling terminal connected to the second output terminal, and a first control terminal connected to a clock signal. A second transistor has a third current-handling terminal connected to the first output terminal, a fourth current-handling terminal connected to the voltage supply terminal, and a second control terminal connected to a first input terminal of the output stage. A third transistor has a fifth current-handling terminal connected to the first output terminal, a sixth current-handling terminal connected to the voltage supply terminal, and a third control terminal connected to the second output terminal.

DETAILED DESCRIPTION OF THE DRAWINGS

Figure 1:
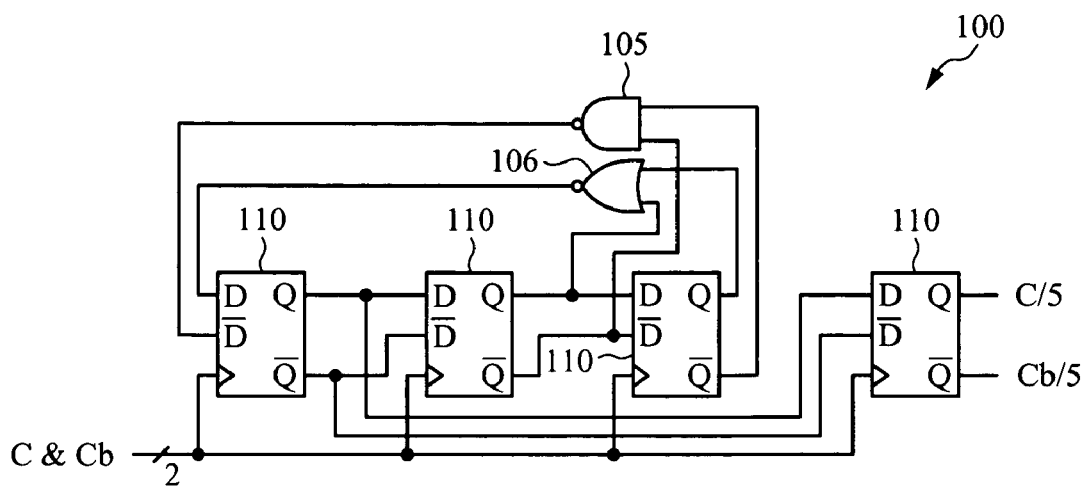
FIG. 1 (prior art) depicts an exemplary logic circuit 100 that includes both combinational and sequential logic elements.
Figure 3:
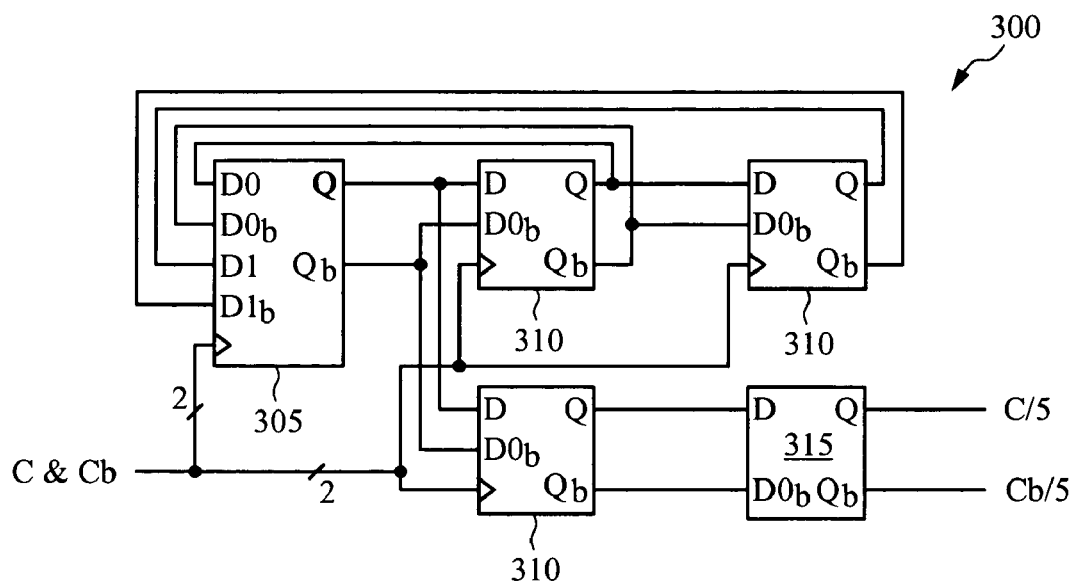
FIG. 3 depicts a divide-by-five circuit 300 that divides a pair of complementary clock signals C and Cb by five.

FIG. 3 depicts a divide-by-five circuit 300 that divides a pair of complementary clock signals C and Cb ("C-bar") by five. Like circuit 100 of FIG. 1, circuit 300 employs differential signaling to improve performance. Circuit 300 differs from circuit 100, however, in that the logic associated with NOR gates 105 of FIG. 1 is incorporated into a single flip-flop 305 adapted to receive two pairs of complementary inputs D0, D0b and D1, D1b. The operation of an embodiment of flip-flop 305 is detailed below in connection with FIG. 6. Flip-flop 305 is described in further detail in U.S. patent application Ser. No. 09/994,233, entitled HIGH-SPEED DIFFERENTIAL FLIP-FLOP, by Michael A. Nix, filed Nov. 26, 2001 the application of which is hereby incorporated by reference in its entirety.

Circuit 300 also includes a number of flip-flops 310 that are modified in accordance with the invention to improve speed performance. Finally, circuit 300 includes a differential to single-ended converter 315. Flip-flops 310 and converter 315 are described below in connection with FIGS. 4, 5, and 7.

Figure 4:
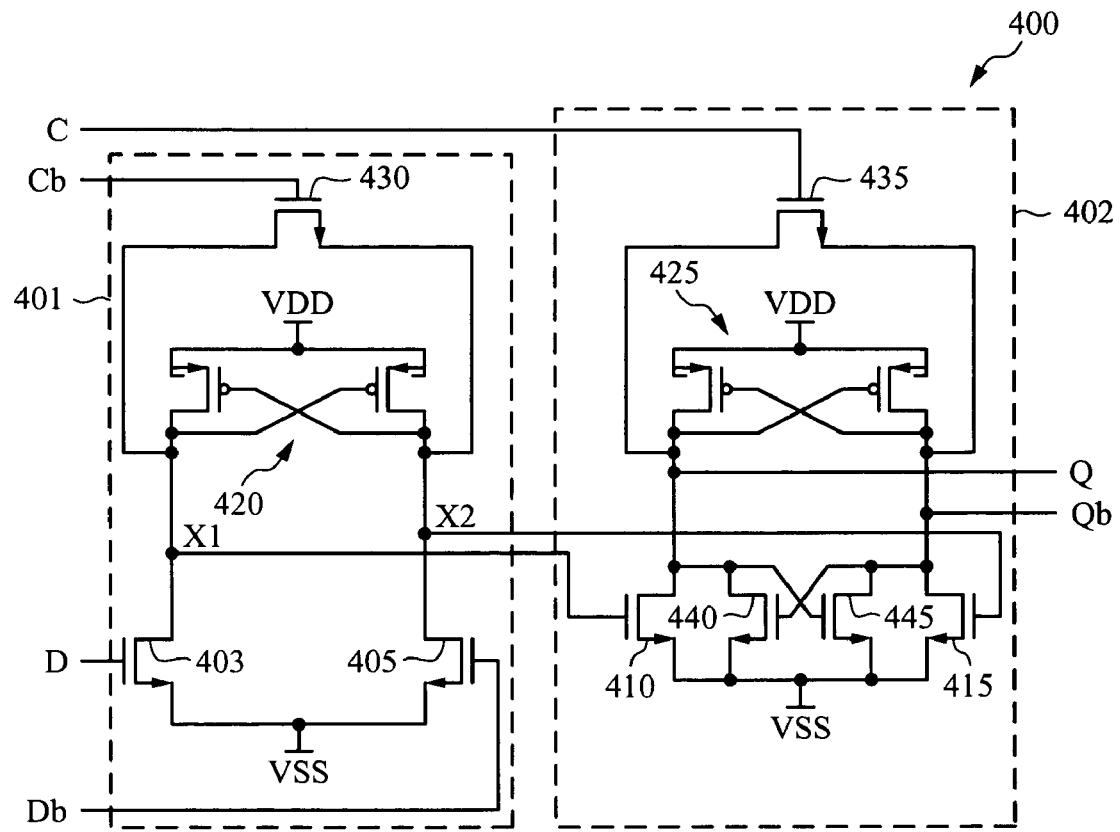
FIG. 4 depicts a flip-flop 400 that is an embodiment of flip-flop 310 of FIG. 3.

FIG. 4 depicts a flip-flop 400 that is an embodiment of flip-flop 310 of FIG. 3. Flip-flop 400 includes an input stage, also known as a "master stage," 401 and an output stage, also known as a "slave stage," 402. The input stage 401 includes a pair of differential transistors 403 and 405, the control inputs of which are connected to respective complementary data inputs D and Db. The output terminals X1 and X2 of the input stage, which are internal nodes, connect to respective control terminals of a pair of differential transistors 410 and 415 in the output stage 402. Hence, the output terminals X1, X2 of the input stage 401 are the input terminals of the output stage 402. The input and output stages include respective cross-coupled PMOS transistor loads 420 and 425.

The input stage 401 includes an n-channel metal-oxide-semiconductor ("NMOS") transistor 430 having one current-handling terminal (e.g. drain) connected to output terminal X1 and the other current-handling terminal (e.g. source) connected to output terminal X2. The control terminal (i.e. gate) of the NMOS transistor 430 is connected to the clock signal Cb.

The output stage 402 likewise includes an NMOS transistor 435, one current-handling terminal, which is connected to output terminal Q. The other current-handling terminal is connected to output terminal Qb. The control terminal of the NMOS transistor 435 is connected to clock signal C. In another embodiment, one of transistors 430 and 435 is substituted with a p-channel metal-oxide-semiconductor ("PMOS") transistor, allowing both control terminals associated with transistors 430 and 435 to be controlled by the same clock signal.

The output stage 402 also includes cross-coupled NMOS transistors 440, 445. The control terminal of NMOS transistor 440 is coupled to output terminal Qb, and the current-handling terminals are connected to Q and voltage supply terminal Vss. Similarly, the control terminal of NMOS 445 is coupled to output terminal Q, and the current-handling terminals are connected to Qb and Vss. These NMOS transistors add additional hysteresis, and have very low threshold, typically about $0.15 V_T$ to about $0.2 V_T$ (compared to about $0.5 V_T$ for a standard NMOS transistor), providing a current path to hold the output values Q, Qb down to Vss or up to the voltage generated by the cross-coupled PMOS transistors 425.

When Cb is high, X1 and X2 go to almost the same voltage value. This value (also called the common-mode) can be a level that leaves transistors 410 and 415 almost off. Without the cross-coupled NMOS transistors 440, 445, Qb is held up by one of the cross-coupled PMOS transistors 425, which leaves Q essentially floating, and Qb is pulled high. Having these terminals float is not overly problematic if the "strength" (transconductance) of the PMOS transistors is essentially even with the strength of the NMOS transistors. However, the relative strengths of the n-channel and p-channel devices change with operating temperature and as a result of process variables that arise when the integrated circuits are fabricated.

In one instance, a design for a differential flip-flop worked well in integrated circuits fabricated in a 180-micron process (i.e. where the critical dimension for the manufacturing process is 180 microns), but did not work well under some circumstances when the design was adapted for fabrication in a 90-micron process. In some cases, the p-channel devices became stronger than the n-channel devices, and in other cases the n-channel devices became stronger than the p-channel devices. Either case produces common-mode voltage variations. If the common-mode voltage variation becomes too large, an unintentional and undesirable downstream bit flip may occur. The problem becomes more pronounced if serial differential flip-flops are used because each stage can act like a D-C amplifier, increasing the variation of the common-mode voltage.

The cross-coupled NMOS transistors 440, 445 slightly increase the input capacitance of the output stage 402, which slows down the high-frequency operation slightly. The improved reliability of operation over temperature and improved yield are more desirable than the slight decrease in maximum operating speed. In a further embodiment, similar cross-coupled NMOS transistors are added to the input stage 401.

Figure 5:
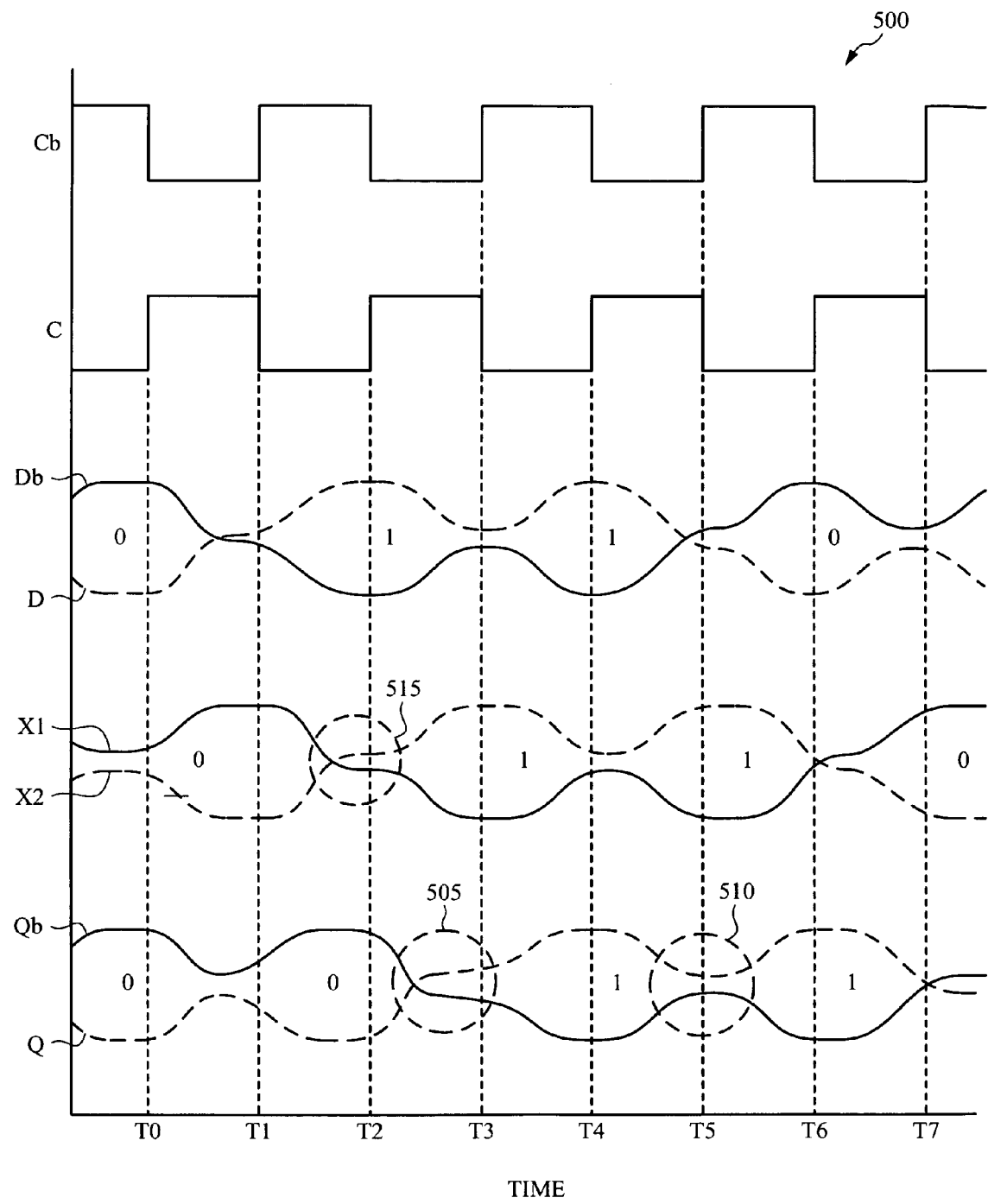
FIG. 5 is a waveform diagram 500 depicting exemplary signals associated with the operation of flip-flop 400 of FIG. 4.

FIG. 5 is a waveform diagram 500 depicting exemplary signals associated with the operation of flip-flop 400 of FIG. 4. Diagram 500 depicts complementary clock signals C and Cb, data signals D and Db, input-stage output signals X1 and X2, and output terminals Q and Qb. The various node labels refer to both the signal and the corresponding circuit node. Whether a given designation refers to a node or a signal will be clear from the context.

Understanding of the waveform diagram 500 is facilitated with reference to the differential flip-flop 400 shown in FIG. 4. Prior to time T0, clock signal Cb is high, so transistor 430 connects output terminals X1 and X2 of the input stage of flip-flop 400. The logic 0 input on the differential terminals D and Db consequently produces only a relatively small voltage difference across terminals X1 and X2. Though limited by the ON resistance of transistor 430, the voltage across terminals X1 and X2 does reflect a logic 0 (i.e. X1>X2).

At time T0, clock signal Cb goes low, turning off transistor 430 to disconnect terminals X1 and X2. The voltage between terminals X1 and X2 thus increases, better representing the difference between input signals on terminals D and Db. Also at time T0, clock signal C goes high, causing transistor 435 to connect output terminals Q and Qb. The voltage difference between signals Q and Qb therefore diminishes (i.e. returns toward zero volts difference). Though limited by the ON resistance of transistor 435, the voltage across terminals Q and Qb continues to reflect a logic 0 (i.e. Q<Qb).

Next, at time T1, clock signal C returns low and complementary clock signal Cb returns high. Transistors 430 and 435 consequently change states, so that terminals X1 and X2 are once again connected, and terminals Q and Qb are disconnected. In this new state, terminals X1 and X2 begin to approach one another and output terminals Q and Qb swing away from one another to reflect the differential input signals to transistors 410 and 415.

Before the differential input terminals D and Db receive a new data bit, the pairs of output terminals X1, X2 and Q, Qb approach one another to limit the maximum amount of voltage swing required to move the differential output signal to the next logic bit. For example, the logic level expressed on output terminal Q from time T2 to time T4 switches from a logical 0 to a logical 1, and the logic level expressed on output terminal Qb switches from T2 to T4 switches from a logical 1 to a logical 0. These transitions are shown as a maximum voltage swing for each of the output terminals Q and Qb.

The time required to make this transition is expedited by beginning to bring Qb lower and Q higher prior to receipt of the data signal indicating the logic transition, shown within the dashed circle 505. The resulting reduction in the maximum voltage swing required to change the logic level expressed on terminals Q and Qb reduces the amount of time required to make logic transitions on terminals Q and Qb. This speeds the logic transitions on the outputs of flip-flop 400 (ref. FIG. 4).

As illustrated in the dashed circle 510 between times T4 and T6, the voltage difference between terminals Q and Qb is reduced even if the next data bit turns out to be the same logic level as the one presently represented. This is because flip-flop 400 cannot anticipate the next logic level, and consequently must prepare for either of the two alternatives. Flip-flop 400 therefore requires some amount of time to transition between two logic zeroes or two logic ones. The overall speed of flip-flop 400 increases because the time required to transition between different logic levels is reduced.

Figure 2:
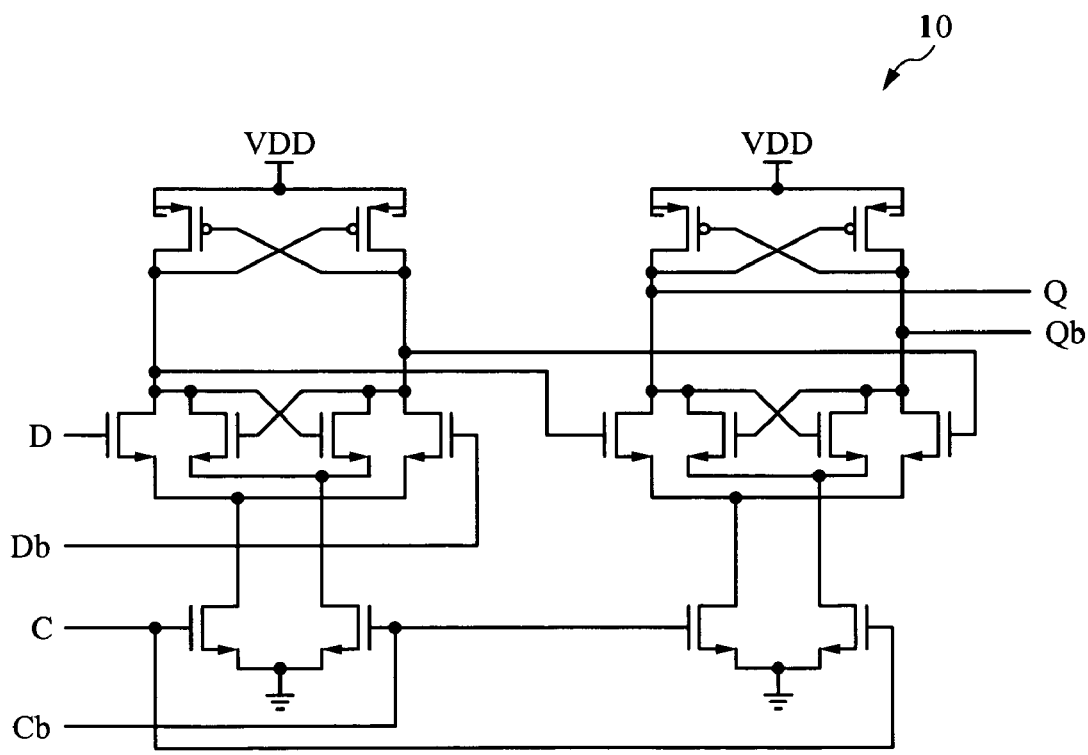
FIG. 2 (prior art) depicts an embodiment of a differential-input flip-flop 110 for use in circuit 100 of FIG. 1.

Reducing the time required for flip-flop 400 to transition between different logic levels translates directly into improved speed performance. Moreover, as compared with flip-flop 110 (FIG. 2), flip-flop 400 has fewer transistors, and can therefore be implemented using less die area. These changes also result in significantly reduced power consumption for a given level of speed performance.

However, it was found that some differential flip-flops optimized for high-speed operation sometimes did not work reliably at lower clock rates. In a particular instance, a differential flip-flop that worked at clock rates up to several GHz did not always work reliably (provide the correct output for a known input) at clock rates below about 1 GHz.

Typically, a flip-flop is designed to have a nominal common-mode voltage about halfway between $V_{DD}$ and ground. It is desirable to avoid shifting the common-mode voltage, otherwise the common-mode voltage may exceed a voltage associated with a logic state ("trigger voltage") by rising above a trigger voltage for a logical 1 when the true data value is a logical 0, for example, or vice versa.

Referring to FIG. 5, Q and Qb are not supposed to respond to input on D and Db until C goes low. At around T2, X1 and X2 cross within the dotted circle 515 and stay close together until a short time after T2. After that, X1 and X2 start to diverge. At a high-frequency clock rate, X1 and X2 do not have much time to diverge, and hence the difference between them, delta X, remains small. At a lower-frequency clock rate, X1 and X2 have more time to diverge before C goes low, which can cause Q and Qb to change logical states (flip) before T3.

The cross-coupled NMOS transistors 440, 445 illustrated in FIG. 4 add additional hysteresis, increasing the time after X1 and X2 cross before they diverge sufficiently to prematurely flip the outputs Q, Qb. As discussed above in reference to FIG. 4, the cross-coupled NMOS transistors 440, 445 provide current paths to hold the outputs Q, Qb up to $V_{DD}$ or down to Vss, respectively.

Figure 6:
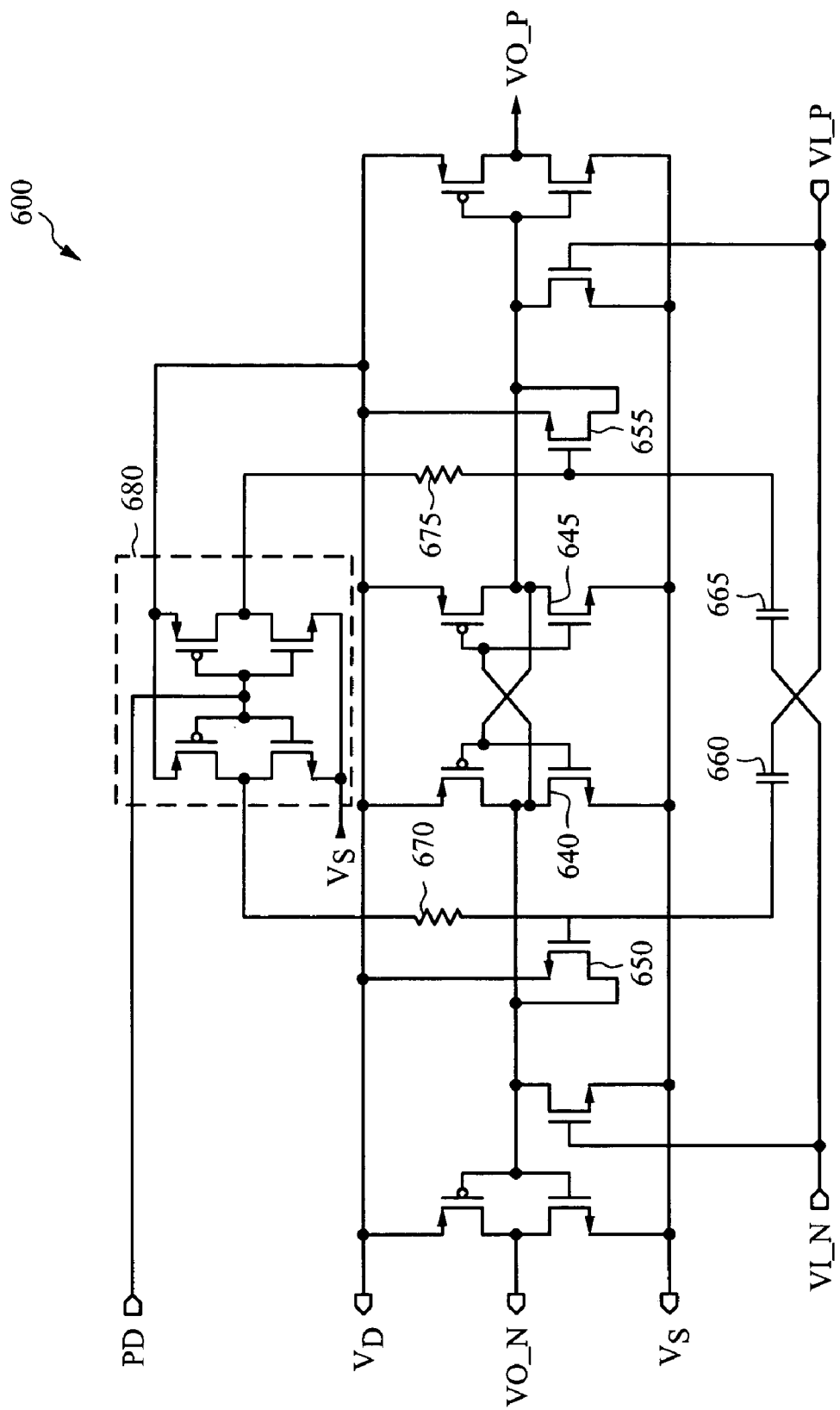
FIG. 6 depicts a differential buffer circuit that is optionally used with high-speed return-to-zero differential flip-flops.

FIG. 6 depicts a differential buffer circuit 600 that is optionally used with high-speed return-to-zero differential flip-flops or other circuits, such as differential clock circuits. A flip-flop might not provide sufficient voltage swing and/or current to drive downstream logic. A buffer circuit is often used to interface with downstream logic. In a particular embodiment, a differential flip-flop operates at about 1.5 V and a differential buffer operates at about 2.5 V. The differential buffer provides essentially rail-to-rail output.

The symmetry of the differential flip-flop 400 shown in FIG. 4 maintains the phase relationship of the differential inputs D, Db to the outputs Q, Qb, with respect to the clock signal(s). In many applications it is desirable to maintain differential signals through the buffer. The buffer 600 shown in FIG. 6 is symmetrical and provides differential outputs. For example, the output does not go though an inverter to obtain a complementary output, as is often done in non-symmetrical buffer circuits.

The buffer 600 includes cross-coupled NMOS transistors 640, 645 that provide a similar function as the cross-coupled NMOS transistors 440, 445 shown in FIG. 4, in that these transistors 640, 645 provide additional hysteresis and improved low-frequency operation of the buffer 600. In one embodiment, the cross-coupled NMOS transistors 640, 645 allow the buffer 600 to operate down to DC.

The buffer 600 also has NMOS transistors 650, 655 that operate as active loads. These transistors 650, 655 are low-threshold devices, and their gates are connected to the primary inputs VI_N, VI_P through capacitors 660, 665. For example, a first primary input VI_N is connected to a first output of a differential flip flop (e.g. Q of differential flip flop 400 shown in FIG. 4) and a second primary input VI_P is connected to a second output of the differential flip-flop (e.g. Qb of differential flip flop 400 shown in FIG. 4), or vice versa, depending on the desired phase relationships. These capacitors are relatively small, each having a capacitance of about 4 femto-Farads, and speed up the operation of the active load NMOS transistors 650, 655 by transferring charge to the gates of the transistors when the primary inputs change state. The gates of the active load NMOS transistors 650, 655 are also biased through resistors 670, 675 to Vs through an optional power-down circuit 680. The optional power-down circuit 680 brings the resistors 670, 675 to ground in response to a power down signal PD to avoid static currents in the buffer 600.

The combination of the active load transistors 650, 655 with the speedup capacitors 660, 665 greatly improves the performance of the buffer 600 for a given power consumption. In other words, the buffer 600 can operate at a higher speed for a fixed power, or can operate on less power at a fixed speed.

Figure 7:
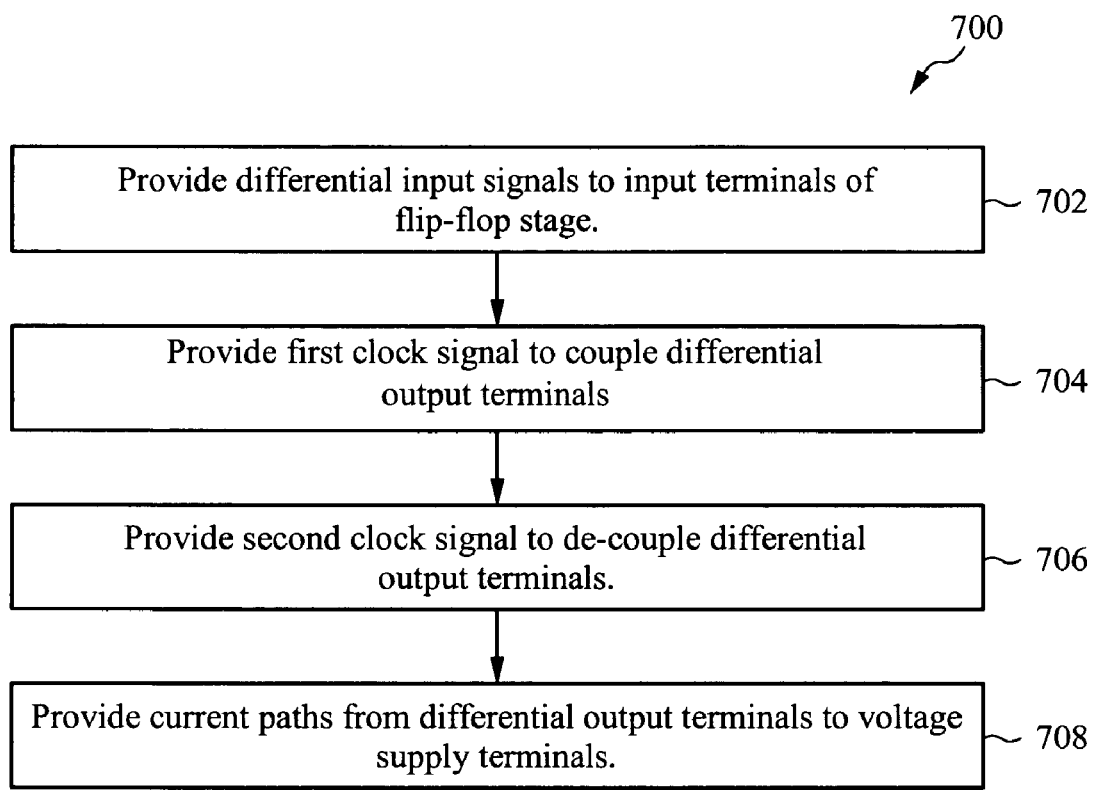
FIG. 7 shows a flow chart of a method of operating a flip-flop according to an embodiment of the invention.

FIG. 7 shows a flow chart of a method of operating a flip-flop 700 according to an embodiment of the invention. Differential input signals are provided to differential input terminals of a stage of a flip-flop (step 702). A first clock signal is provided to the stage of the flip flop to couple a first differential output terminal to a second differential output terminal (step 704). A second clock signal is provided to the stage of the flip flop to de-couple the first differential output terminal from the second differential output terminal (step 706). Current paths from both differential output terminals are provided to both voltage supply terminals of the flip-flop (step 708), so as to avoid floating one or both of the differential output terminals.

While the present invention has been described in connection with specific embodiments, variations of these embodiments will be obvious to those of ordinary skill in the art. For example, the invention can be adapted for use with other types of sequential logic elements, such as single-stage latches, toggle flip-flops, J-K flip-flops, AND-input flip-flops, or XOR-input flip-flops. Moreover, some components are shown directly connected to one another while others are shown connected via intermediate components. In each instance, the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

The invention claimed is:

1. A flip-flop comprising:
    an input stage having complementary data inputs and complementary output terminals coupled to a first and a second input terminal of an output stage, the output stage including
    a first transistor having
        a first current-handling terminal connected to a first output terminal of the flip-flop,
        a second current-handling terminal connected to a second output terminal of the flip-flop, and
        a first control terminal connected to a clock signal;
    a second transistor having
        a third current-handling terminal connected to the first output terminal of the flip-flop,
        a fourth current-handling terminal continuously connected to a first voltage supply terminal, and
        a second control terminal connected to the first input terminal;

a third transistor having
  a fifth current-handling terminal connected to the first output terminal of the flip-flop,
  a sixth current-handling terminal connected to the first voltage supply terminal, and
  a third control terminal continuously connected to the second output terminal of the flip-flop; and
a cross coupled circuit having a cross coupled transistor continuously connected to a second voltage supply terminal, wherein a gate of the cross coupled transistor is connected to the second output terminal of the flip-flop; and
wherein the second transistor has a first threshold and the third transistor has a second threshold, the second threshold being lower than the first threshold.

2. The flip-flop of claim 1 wherein the first voltage supply terminal of said output stage is connected to ground, the second voltage supply terminal is connected to a positive voltage supply, and the cross coupled circuit further comprises: a second cross coupled transistor, wherein a gate of the second cross coupled transistor is connected to the first output terminal of the flip-flop and said output stage further comprises
a fourth transistor having
  a seventh current-handling terminal connected to the second output terminal,
  an eighth current-handling terminal connected to the first voltage supply terminal, and
  a fourth control terminal continuously connected to the first output terminal of the flip-flop.

3. The flip-flop of claim 1 wherein the third transistor is an n-channel metal-oxide semiconductor transistor.

4. The flip-flop of claim 1 wherein the first threshold is about 0.5 Volts and the second threshold is not greater than about 0.2 Volts.

5. The flip-flop of claim 1 wherein the cross-coupled transistor is a p-channel metal-oxide semiconductor transistor.

6. The flip-flop of claim 1, wherein said output stage further comprises:
a fourth transistor having:
  a seventh current-handling terminal connected to the second output terminal of the flip-flop,
  an eighth current-handling terminal connected to the first voltage supply terminal, and
  a fourth control terminal connected to the second input terminal.

7. The flip-flop of claim 6 wherein the first input terminal and the second input terminal receive differential input signals from the input stage.

8. The flip-flop of claim 7, wherein the first output terminal of the flip-flop and the second output terminal of the flip-flop provide differential output signals.

9. The flip-flop of claim 6, wherein said output stage further comprises:
a fifth transistor having
  a ninth current-handling terminal connected to the second output terminal of the flip-flop,
  a tenth current-handling terminal connected to the first voltage supply terminal, and
  a fifth control terminal connected to the first output terminal of the flip-flop.

10. The flip-flop of claim 1 further comprising:
a buffer having:
  a first buffer input terminal coupled to the first output terminal of the differential output stage of the flip-flop,
  a second buffer input terminal coupled to the second output terminal of the differential output stage of the flip-flop,
  a first buffer output terminal,
  a second buffer output terminal,
  a buffer voltage supply terminal,
  a first n-channel metal-oxide-semiconductor ("NMOS") transistor having:
    a first NMOS current-handling terminal,
    a second NMOS current-handling terminal connected to the buffer voltage supply,
    a first NMOS control terminal; and
  a second NMOS transistor having:
    a third NMOS current-handling terminal,
    a fourth NMOS current-handling terminal connected to the buffer voltage supply, and
    a second NMOS control terminal, wherein the first NMOS control terminal is connected to the third NMOS current-handling terminal and the second NMOS control terminal is connected to the first NMOS current-handling terminal.

11. The flip-flop of claim 10 further comprising:
a first capacitor;
a first active load transistor having:
  a first active load current-handling terminal connected to the first current-handling terminal,
  a second active load current-handling terminal connected to a second buffer voltage supply terminal, and
  a first active load control terminal connected to the first buffer input terminal through the first capacitor;
a second capacitor; and
a second active load transistor having
  a third active load current-handling terminal connected to the third current-handling terminal,
  a fourth active load current-handling terminal connected to the second buffer voltage supply terminal, and
  a second active load control terminal connected to the second buffer input terminal through the second capacitor.

12. A flip-flop comprising:
a differential input stage comprising:
  differential first and second input terminals and complementary first and second output terminals;
  a first transistor having a current-handling terminal continuously connected to a VSS power supply and a gate connected to the first input terminal; and
  first cross coupled circuit including a first cross coupled transistor having a gate connected to the second output terminal; and
a differential output stage comprising:
  a second transistor having:
    a first current-handling terminal connected to a third output terminal,
    a second current-handling terminal connected to a fourth output terminal, and
    a control terminal connected to a clock signal;
  a third transistor having
    a first current-handling terminal connected to the third output terminal,
    a second current-handling terminal continuously connected to the VSS power supply, and
    a control terminal connected to the first output terminal of the differential input stage; and a fourth transistor having
   a first current-handling terminal connected to the third output terminal,
   a second current-handling terminal continuously connected to the VSS power supply, and
   a control terminal connected to the fourth output terminal; and
a second cross coupled circuit having a second cross coupled transistor configured to continuously receive power from a VDD power supply, wherein a gate of the second cross coupled transistor is connected to the fourth output terminal; and
   wherein the third transistor has a first threshold and the fourth transistor has a second threshold, the second threshold being lower than the first threshold.

13. The flip-flop of claim 12 wherein the first threshold is a standard NMOS transistor's threshold and the second threshold is a very low NMOS transistor's threshold.

* * * * *